United States Patent
Yang et al.

(10) Patent No.: US 6,898,126 B1
(45) Date of Patent: May 24, 2005

(54) METHOD OF PROGRAMMING A FLASH MEMORY THROUGH BOOSTING A VOLTAGE LEVEL OF A SOURCE LINE

(75) Inventors: Ching-Sung Yang, Hsin-Chu (TW); Hsiang-Chung Chang, Tai-Chung (TW); Wei-Zhe Wong, Tai-Nan (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/707,440

(22) Filed: Dec. 15, 2003

(51) Int. Cl.$^7$ ............................................. G11C 16/04

(52) U.S. Cl. .............................. 365/185.26; 365/185.01

(58) Field of Search ....................... 365/185.26, 185.14, 365/185.01

(56) References Cited

U.S. PATENT DOCUMENTS 6,064,592 A * 5/2000 Nakagawa et al. .... 365/185.05

* cited by examiner

*Primary Examiner*—Thong Q. Le
(74) *Attorney, Agent, or Firm*—Winston Hsu

(57) ABSTRACT

A method of programming a flash memory through boosting a voltage level of a source line. The flash memory has n memory cell transistors cascaded in series, a local bit line positioned above the n memory cell transistors, a buried bit line positioned under the n memory cell transistors, and a source line positioned under the buried bit line. The method includes inputting a word line voltage to a control gate of a $k^{th}$ memory cell transistor, and after floating the local bit line, inputting a source line voltage to the source line for inducing an FN tunneling effect inside the $k^{th}$ memory cell transistor through capacitance coupling between the buried bit line and the source line.

15 Claims, 4 Drawing Sheets

METHOD OF PROGRAMMING A FLASH MEMORY THROUGH BOOSTING A VOLTAGE LEVEL OF A SOURCE LINE

BACKGROUND OF INVENTION

1. Field of the Invention

The present invention relates to a method for programming a flash memory. In particular, the present invention discloses a method of programming a flash memory through boosting a voltage level of a source line.

2. Description of the Prior Art

Recently, the demand on portable electronic devices grows dramatically. Therefore, advanced technology associated with the flash memory or the electrically erasable programmable read-only memory (EEPROM) is developed, and the corresponding market is prosperous. The portable electronic devices include films of digital cameras and storage devices of cellular phones, video game apparatuses, and personal digital assistants, answering machines, and programmable ICs. The flash memory is a non-volatile memory, and it records data through altering a threshold voltage of a transistor (a memory cell) to control establishment of the conductive channel. In addition, the stored data are not flushed when the electric power inputted into the flash memory is cut. Generally speaking, the flash memory is cataloged into an NOR cell type and an NAND cell type. It is well-known that the NOR flash memory has quick data access, and commonly functions as a code flash device for processing program codes. In addition, the NAND flash memory has a greater cell density, and commonly functions as a data flash device for storing massive data.

Please refer to FIG. 1, which is a section view of a prior art NAND flash memory 10. The flash memory 10 has an N-doped substrate 11, a deep P-well (DPW) 12, a cell N-well (CNW) 14, a shallow P-well (SPW) 16 isolated by a shallow trench isolation (STI) 15, and an NAND memory cell string 18. The NAND memory cell string 18 has a plurality of NMOS memory cells cascaded in series. In other words, the NAND memory cell string 18 shown in FIG. 1 has 8 cell transistors $M_0$–$M_7$ functioning as the NMOS memory cells. Each of the cell transistors $M_0$–$M_7$ has a stacked gate structure. The stacked gate structure has a control gate 20 and a floating gate 22. The word lines $WL_0$–$WL_7$ are respectively connected to control gates 20 of the cell transistors $M_0$–$M_7$. That is, one control gate 20 corresponds to a specific word line for receiving a word line voltage. One side of the NAND memory cell string 18 is connected to a source line selecting transistor SGS. The source line selecting transistor SGS has a structure identical to that of the cell transistor $M_0$–$M_7$. Therefore, the source line selecting transistor SGS also has a control gate and a floating gate. However, the control gate and the floating gate of the source line selecting transistor SGS are electrically connected. One end of the source line selecting transistor SGS is electrically connected to a source of the cell transistor $M_7$ within the memory cell string 18, and another end of the source line selecting transistor SGS is electrically connected to the cell N-well 14. The cell N-well 14 is used for delivering a source line voltage, and functions as a source line (SL). The source line selecting transistor SGS is used to control if the cell transistor $M_7$ is electrically connected to the source line SL. At another side of the NAND memory cell string 18, a contact plug 24 is electrically connected to a drain of the cell transistor $M_0$, and contacts the shallow P-well 16. In other words, the drain of cell transistor $M_0$ is electrically connected to the shallow P-well 16. In addition, the contact plug 24 also contacts a local bit line (LBL) 26, and the local bit line 26 is electrically connected to one end of a main bit line selecting transistor SGB through another contact plug 28. The main bit line selecting transistor SGB is formed on a P-well 32, and functions as a switch used for controlling if a driving voltage delivered via a main bit line (MBL) 30 is passed to the local bit line 26.

Please note that only one memory cell string 18 is shown in FIG. 1. However, as shown in FIG. 1, another source line selecting transistor, which is electrically connected to the cell N-well 14, is positioned near one side of the source line selecting transistor SGS. This source line selecting transistor is also used for controlling if cell transistors of another memory cell string (not shown) are electrically connected to the source line. Concerning the same local bit line 26, it can be connected to a plurality of memory cell strings 18. For example, the same local bit line 26 is capable of delivering one bit line voltage to 8 memory cell strings 18 for control operations of the cell transistors within 8 memory cell strings 18.

Please refer to FIG. 2, which is a first equivalent circuit diagram of the flash memory 10 shown in FIG. 1. Please note that only 8 cell transistors $M_0$–$M_7$ within one memory cell string 18 are shown in FIG. 1 for simplicity. However, the flash memory 10 actually is capable of having a plurality of memory cell strings 18, and each memory cell string 18 can be built by a plurality of cell transistors. The cell transistors respectively correspond to different bit lines and word lines. In FIG. 2, the flash memory 10 has two memory cell strings 34a, 34b, and each of the memory cell strings 34a, 34b has 8 cell transistors $M_0$–$M_7$. The memory cell string 34a corresponds to a local bit line $LBL_0$ and a main bit line $MBL_0$. A shallow P-well SPW is used to function as a buried bit line electrically connected to the local bit line $LBL_0$. In addition, a P-N junction between the shallow P-well $SPW_0$ and the cell N-well CNW can be regarded as a diode 36a. Similarly, another P-N junction between the deep P-well DPW and the cell N-well CNW functions as a diode 36b as well.

Concerning another memory cell string 34b, it corresponds to the local bit line $LBL_1$ and the main bit line $MBL_1$. A shallow P-well $SPW_1$ is used to be a buried bit line electrically connected to the local bit line $LBL_1$. In other words, both of the memory cell strings 34a, 34b have the same structure. However, the operation of the memory cell string 34a is controlled by the local bit line $LBL_0$ and the main bit line $MBL_0$, and the operation of the memory cell string 34b is controlled by the local bit line $LBL_1$ and the main bit line $MBL_1$.

With the help of the main bit line selecting transistors $SGB_0$, $SGB_1$ that control signals transmitted via the main bit lines $MBL_0$, $MBL_1$ and the source line selecting transistors $SGS_0$, $SGS_1$ that control signals transmitted via the source line SL, the prior art flash memory 10, as shown in FIG. 2, utilizes the buried bit lines established by the shallow P-wells $SPW_0$, $SPW_1$ to activate Fowler-Nordheim (FN) tunneling through low driving voltages. For example, suppose that the cell transistor $M_3$ within the memory cell string 34b is selected, and needs to be programmed for keeping data. Now, the deep P-well DPW corresponds to a voltage level equaling 0V, and the word line $WL_3$ corresponding to the selected cell transistor $M_3$ is driven by a word line voltage equaling 10V. Regarding the unselected word lines $WL_0$–$WL_2$, $WL_4$–$WL_7$, they are driven by a word line voltage equaling 0V. In addition, the main bit line $MBL_1$ corresponding to the selected cell transistor $M_3$ is driven by a bit line voltage equaling +7V, and the unselected main bit line $MBL_0$ is driven by a bit line voltage equaling 0V.

After the voltage level of the main bit line $MBL_1$ is driven by a charge pump circuit to approach +7V, a driving voltage equaling +9V is inputted to the gates of the bit line selecting transistors $SGB_0$, $SGB_1$, and another driving voltage equaling 2V is inputted to the gates of the source line selecting transistors $SGS_0$, $SGS_1$. Then, the bit line selecting transistors $SGB_0$, $SGB_1$ are turned on. Therefore, the main bit line $MBL$ starts driving voltage levels of the local bit line $LBL_0$ and the buried bit line built by the shallow P-well $SPW_0$ to approach 0V. In addition, the main bit line $MBL_1$ starts driving voltage levels of the local bit line LBL and the buried bit line built by the shallow P-well $SPW_1$ to approach +7V. Because the source line selecting transistors $SGS_0$, $SGS_1$ are not turned on, one side of each memory cell string 34a, 34b is floating. Based on the above-mentioned conditions, the selected cell transistor $M_3$ within the memory cell string 34b expels electrons from its floating gate through the FN tunneling mechanism. The selected cell transistor $M_3$ is adjusted to have a lower threshold voltage, and the selected cell transistor $M_3$ is successfully programmed to record a predetermined logic value.

Generally speaking, the prior art flash memory 10 needs $200\mu$ s to complete the above-mentioned programming operation, wherein $10\mu$ s is required by the charge pump circuit to drive the voltage level of the main bit line MBL to approach +7V. Suppose that one memory block contains 4 k main bit lines, and each main bit line has a capacitance value equaling 6 pF. Therefore, when all of the cell transistors at the same bit line are going to be programmed, the charge pump circuit has to simultaneously drive voltage levels of the 4 k main bit lines to approach +7V. According to the well-known formula Q=C*V, that is, 7V*4 k*6 pF=$10\mu$ s*I, it is obvious that the required maximum driving current I corresponds to 16.8 mA. Because the main bit line has a greater capacitance value, the charge pump circuit needs to have a great driving capacity for driving the voltage levels of the main bit lines to approach +7V in $10\mu$ s. In other words, the charge pump circuit requires a larger chip area to accommodate desired circuit components used for generating the needed driving current. Therefore, it is difficult to reduce the overall size of the flash memory 10 owing to the implemented charge pump circuit.

SUMMARY OF INVENTION

It is therefore a primary objective of this invention to provide a method of programming a flash memory through boosting a voltage level of a source line.

Briefly summarized, the preferred embodiment of the present invention provides a method of programming a non-volatile memory. The non-volatile memory comprises n cell transistors cascaded in series, wherein each cell transistor has a control gate, a floating gate, a source, and a drain; a local bit line positioned above the n cell transistors, wherein the local bit line is electrically connected to a drain of a $1^{st}$ cell transistor; a buried local bit line positioned under the n cell transistors, wherein the buried local bit line is electrically connected to the drain of the $1^{st}$ cell transistor; and a source line positioned under the buried local bit line, wherein the source line is capable of being electrically connected to a source of a nth cell transistor. The method comprises inputting a word line voltage to a control gate of a $k^{th}$ cell transistor and floating the local bit line, and inputting a first source line voltage to the source line for increasing a voltage difference between the control gate of the $k^{th}$ cell transistor and the buried local bit line through capacitance coupling between the buried local bit line and the source line. The voltage difference is used to adjust an amount of electrons stored on the floating gate of the $k^{th}$ cell transistor for programming the $k^{th}$ cell transistor.

It is an advantage of the present invention that a charge pump circuit encounters a smaller loading capacitor when driving a source line. Therefore, the charge pump circuit is merely required to provide a small driving current. Therefore, the power requirement of the charge pump circuit is eased, and the chip size occupied by the charge pump circuit is reduced.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
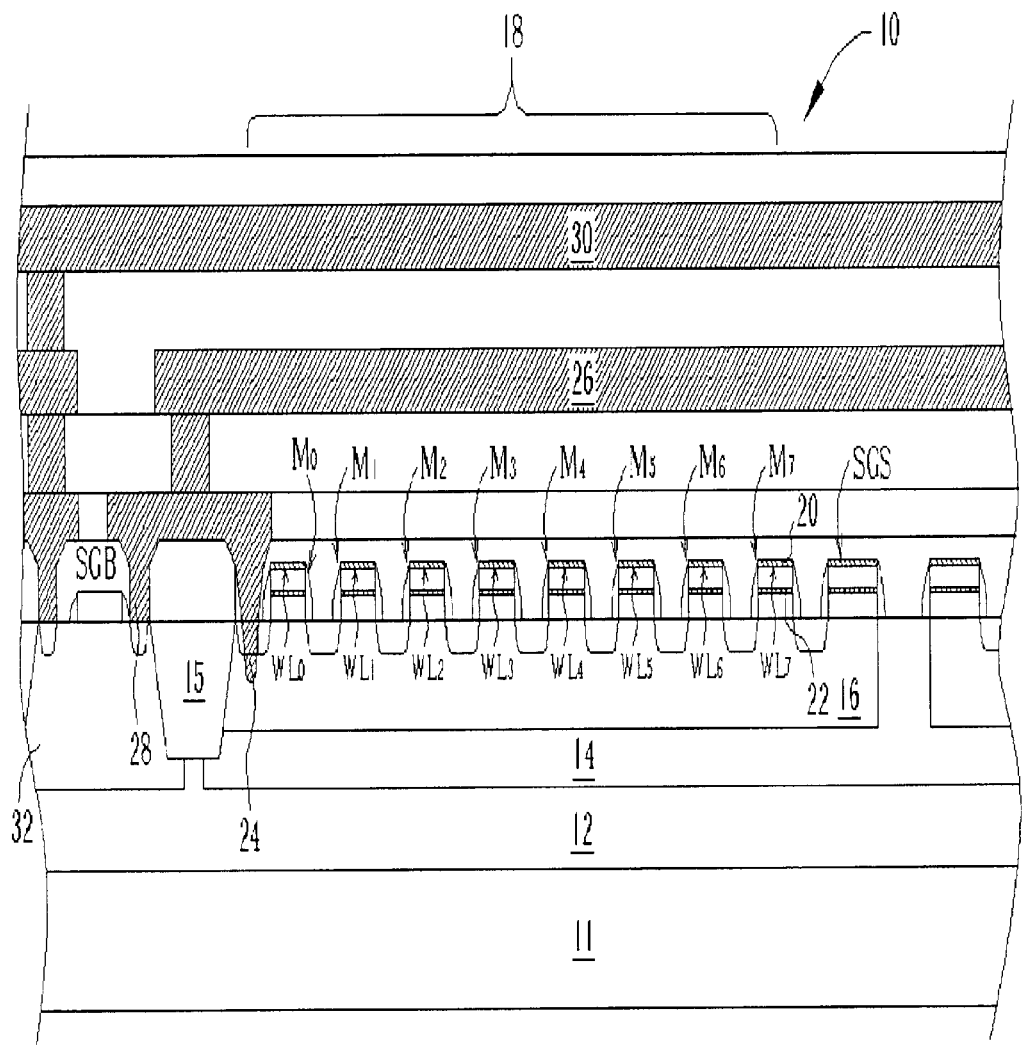
FIG. 1 is a section view of a prior art NAND flash memory.
Figure 2:
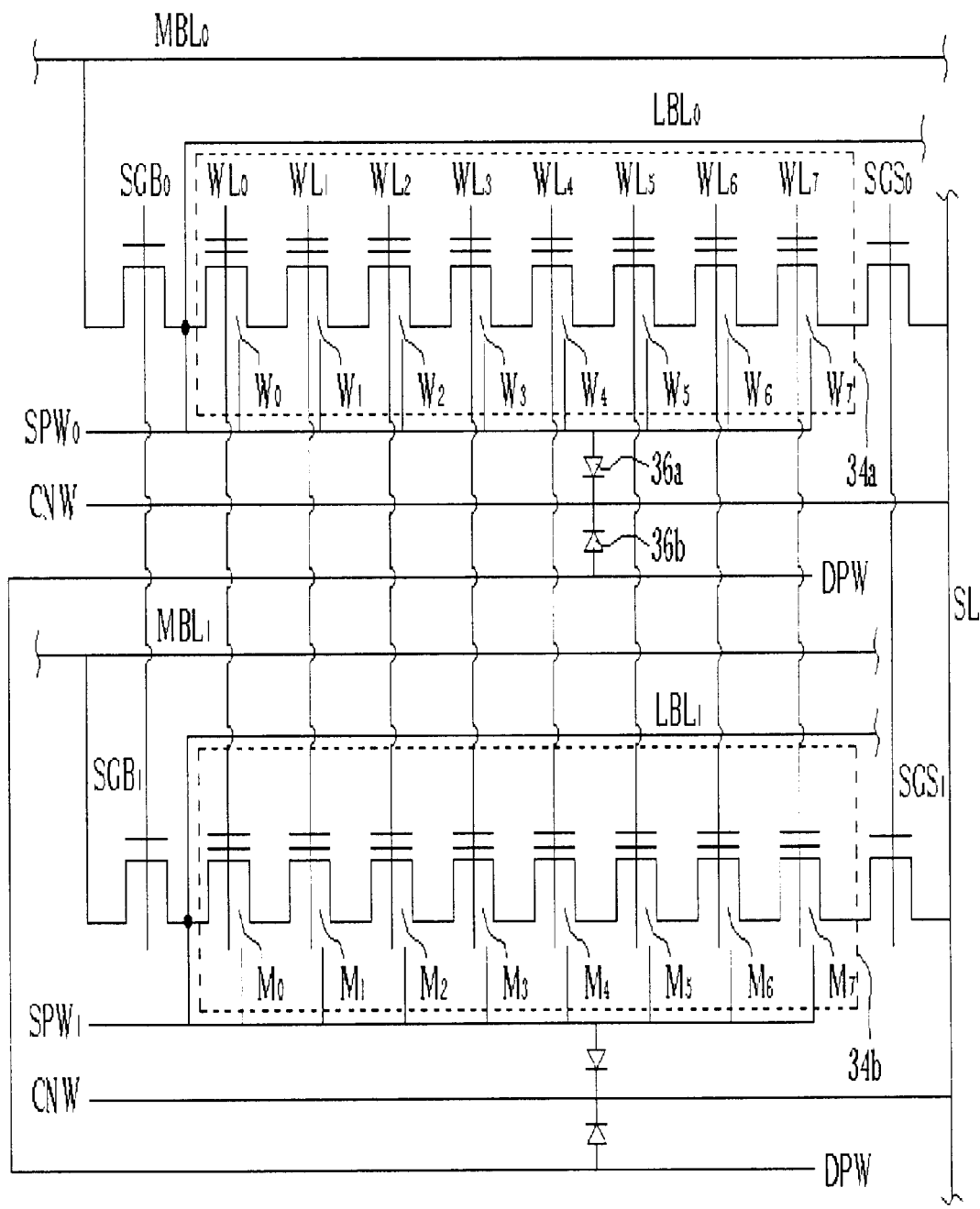
FIG. 2 is a first equivalent circuit diagram of the flash memory shown in FIG. 1.
Figure 3:
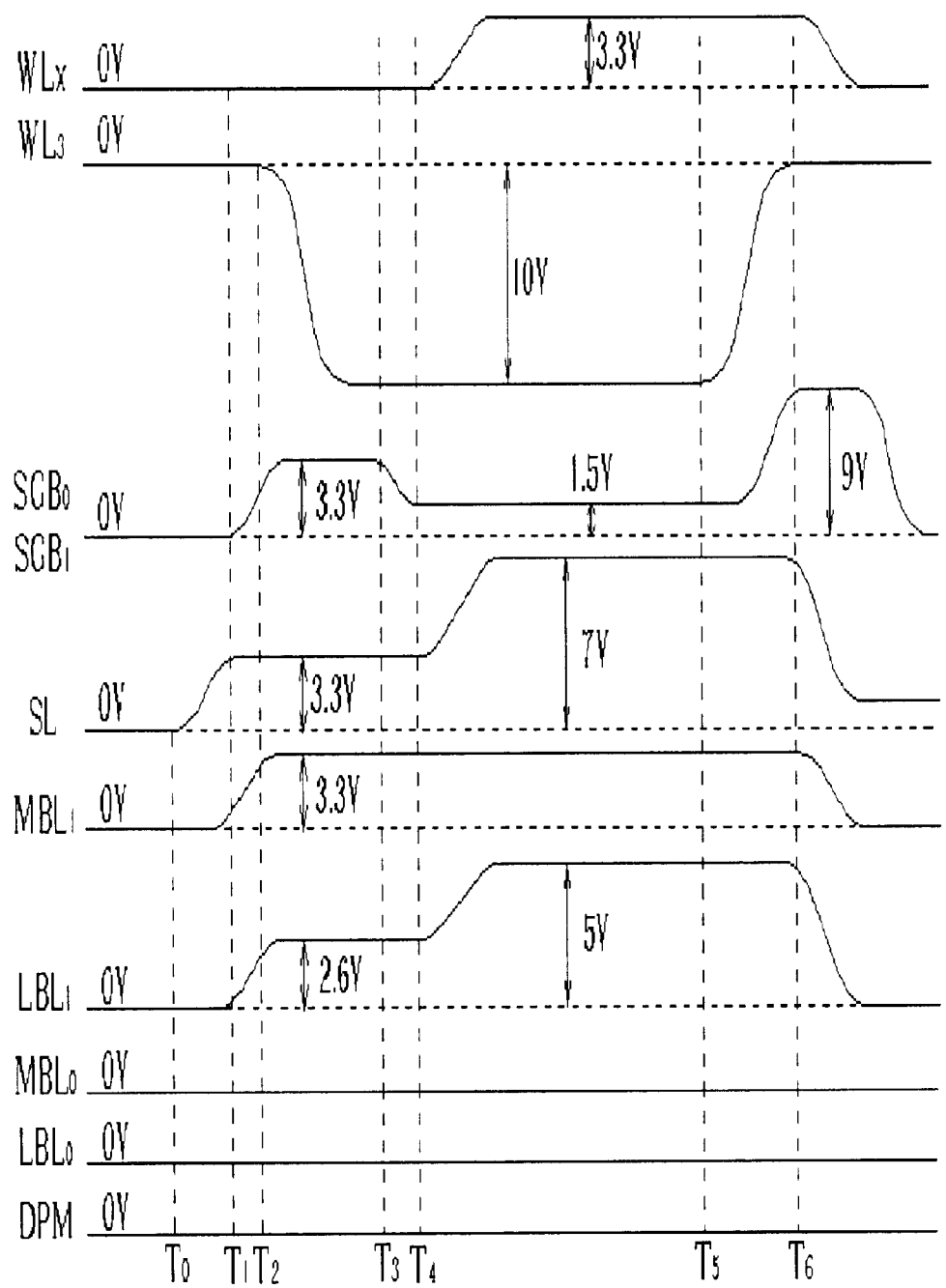
FIG. 3 is a timing diagram illustrating operations of programming a flash memory according to the present invention.

Please refer to FIG. 3 in conjunction with FIG. 2. FIG. 3 is a timing diagram illustrating operations of programming a flash memory according to the present invention. The method of programming a flash memory according to the present invention is applied to the flash memory 10 shown in FIG. 1 and FIG. 2. Because the component structure shown in FIG. 1 and the circuit structure shown in FIG. 2 are clearly described before, the lengthy description is not repeated. Suppose that the cell transistor $M_3$ within the memory cell string 34b shown in FIG. 2 needs to be programmed for recording data. At $T_0$, the voltage level of the source line SL is first raised from 0V toward a low voltage level Vcc. In the preferred embodiment, the low voltage level Vcc is a voltage level (3.3V for example) provided by an external power supply when the flash memory 10 works. At $T_1$, the voltage levels of the control gates of the main bit line selecting transistors $SGB_0$, $SGB_1$ are raised from 0V toward the low voltage level Vcc. Therefore, both of the main bit line selecting transistors $SGB_0$, SGB are turned on. In addition, because no cell transistor within the memory cell string 34a needs to be programmed at $T_1$, the main bit line MBL corresponding to the memory cell string 34a still holds a voltage level equaling 0V. On the contrary, because the memory cell string 34b has the selected cell transistor $M_3$, a voltage level of the main bit line $MBL_1$ corresponding to the memory cell string 34b is raised from 0V toward the low voltage level Vcc.

Because the main bit line selecting transistors $SGB_0$, SGB are turned on after $T_1$, the voltage levels of the main bit lines $MBL_0$, $MBL_1$ then affect corresponding local bit lines $LBL_0$, $LBL_1$. That is, the voltage level of the local bit line $LBL_0$ still approaches 0V after $T_1$ However, the voltage level of the local bit line LBL approaches (Vcc-Vth), wherein Vth represents a threshold voltage of the main bit line selecting transistor $SGB_1$. For instance, if Vth equals 0.7V, the voltage level of the local bit line $LBL_1$ becomes 2.6V.

At $T_2$, the voltage level of the word line $WL_3$ corresponding to the selected cell transistor $M_3$ is driven from original 0V to approach 10V. For unselected cell transistors $M_x$ (the cell transistor $M_0$ for example) within the memory cell string 34b, the corresponding word lines $WL_x$ (the word line $WL_0$ for example) still hold 0V. Then, the voltage levels of control gates of the main bit line selecting transistors $SGB_0$, $SGB_1$ are dropped from Vcc toward 1.5V at $T_3$. The voltage level of the main bit line MBL still corresponds to 0V. Therefore, the main bit line selecting transistor $SGB_0$ is still turned on to continue driving the local bit line $LBL_0$ to hold 0V. However, because the voltage level of the main bit line $MBL_1$ is equal to Vcc, the main bit line selecting transistor $SGB_1$ is turned off. In other words, the local bit line $LBL_1$ is floating after $T_3$.

Next, the method of programming the flash memory according to the present invention starts boosting the voltage level of the source line SL. In the preferred embodiment, the voltage level of the source line SL is raised from Vcc toward a high voltage level +7V at $T_4$. As shown in FIG. 2, one end of the buried bit line built by the shallow P-well SPW is electrically connected to the local bit line $LBL_1$, and another end of the buried bit line corresponds to an open circuit. Therefore, when the local bit line $LBL_1$ is floating owing to the disabled main bit line selecting transistor $SGB_1$, the buried bit line and corresponding local bit line $LBL_1$ are floating as well. As shown in FIG. 3, the voltage difference between the local bit line $LBL_1$ and the source line SL is equal to 0.7V before $T_4$. However, when the voltage level of the source line SL is raised from Vcc to +7V after $T_4$, the capacitance coupling between the cell N-well CNW and the buried bit line (the shallow P-well $SPW_1$) corresponding to the local bit line $LBL_1$ increases the voltage level of the floating local bit line $LBL_1$ owing to the voltage boost at the source line SL. Please note that the cell N-well CNW is electrically connected to the source line SL, and the shallow P-well $SPW_1$ is electrically connected to the local bit line $LBL_1$. In other words, because the voltage level of the source line SL is increased by +3.7V, and is raised from Vcc to +7V, the voltage level of the floating shallow P-well $SPW_1$ is accordingly raised owing to the capacitance coupling for holding the original voltage difference (0.7V) between the shallow P-well $SPW_1$ and the source line SL.

In addition, concerning the memory cell string 34b having the selected cell transistor $M_3$, voltage levels of those word lines $WL_x$ corresponding to the unselected cell transistors at the same local bit line LBL are raised from 0V to Vcc after $T_4$. The above operation has two main objectives. One is to alleviate the bit line disturbance, and another is to further boost the voltage level of the local bit line $LBL_1$. As mentioned above, the voltage level of the local bit line $LBL_1$ is increased. With regard to the bit line disturbance, if the voltage levels of the unselected word lines $WL_x$ equal 0V, a voltage difference is induced between the control gate of each unselected cell transistor and the shallow P-well $SPW_1$. Though the induced voltage difference is not high enough to greatly expel the electrons on the control gate of the unselected cell transistor, it is capable of expelling a small amount of electrons originally stored on the floating gate of the unselected cell transistor. For instance, suppose that only the cell transistor M within the memory cell string 34b does not need to be programmed, and the remaining cell transistors $M_1$–$M_7$ are programmed for recording data. As mentioned above, the programming operation is repeatedly performed 7 times to program the target cell transistors $M_1$–$M_7$. Therefore, the small voltage difference between the control gate of the cell transistor $M_0$ and the shallow P-well $SPW_1$ gradually reduces the amount of electrons stored on the floating gate of the unselected cell transistor $M_0$. Concerning the worst case, the amount of electrons stored on the unselected cell transistor $M_0$ is less than a predetermined quantity after a period of time, and the unselected cell transistor $M_0$ is erroneously programmed.

Generally speaking, each of the memory cell strings 34a, 34b actually corresponds to 32 bit lines. In addition, the number of the memory cell strings corresponding to the same local bit line probably equals 8 or much more. Thus, for the unselected cell transistors corresponding to the same local bit line, they are easily influenced to lose the stored electrons because of the raised voltage level of the local bit line. Therefore, when a reading operation is performed, the erroneous logic value is outputted. In the preferred embodiment, when the voltage level of the local bit line $LBL_1$ is increased to reach +5V after $T_4$ for activating the FN tunneling inside the cell transistor $M_3$, the voltage level of the control gate of the unselected cell transistor is also raised to Vcc. It is obvious that the voltage difference between the control gate of the unselected cell transistor and the shallow P-well $SPW_1$ is reduced. In other words, the voltage level of the control gate of the unselected cell transistor is increased to slow the ejection rate of the originally stored electrons. Therefore, the bit line disturbance is eased.

It is obvious that an oxide layer exists between the shallow P-well $SPW_1$ and the control gate of the unselected cell transistor. Thus, an equivalent capacitor is established between the shallow P-well $SPW_1$ and the control gate of the unselected cell transistor. Before $T_4$, a voltage difference between the shallow P-well $SPW_1$ and the control gate of the unselected cell is equal to 2.6V. That is, the voltage difference kept by the capacitor is equal to 2.6V. However, the voltage level of the control gate of the unselected cell transistor is increased to approach Vcc after $T_4$. As mentioned above, the local bit line $LBL_1$ remains floating at this time. Therefore, the raised voltage level of the control gate of the unselected cell pulls up the voltage level of the shallow P-well $SPW_1$ through the well-known capacitance coupling. That is, not only does the source line SL boost the voltage level of the local bit line $LBL_1$, but the voltage level of the control gate of the unselected cell transistor increases the voltage level of the local bit line $LBL_1$. In the end, the local bit line $LBL_1$ is capable of having a voltage level equaling +5V that is great enough to enable the FN tunneling inside the cell transistor $M_3$ for completing the desired programming operation.

Next, in order to terminate the programming operation imposed on the cell transistor $M_3$, the voltage level of the word line $WL_3$ corresponding to the cell transistor $M_3$ is reduced from 10V to an initial voltage level (0V) after $T_5$, and the voltage levels of the control gates of the main bit line selecting transistors $SGB_0$, $SGB_1$ are driven to approach +9V. Finally, the voltage levels of the main bit line $MBL_1$, the local bit line $LBL_1$, and the word lines of the unselected cell transistors correspond to the initial voltage level (0V).

As described before, the method of programming the flash memory according to the present invention utilizes the capacitance coupling between the source line SL and the shallow P-well $SPW_1$ to provide the local bit line $LBL_1$ with an appropriate voltage level to program the selected cell transistor $M_3$ within the memory cell string 34b. That is, the claimed method utilizes the source line SL to input a high voltage level (+7V for example) used for activating the FN tunneling inside the cell transistor $M_3$. Because the source line SL functioning as an input port corresponds to a smaller capacitance value, a small driving current is capable of driving the source line SL to approach the wanted high voltage level. The reason is described as follows.

Figure 4:
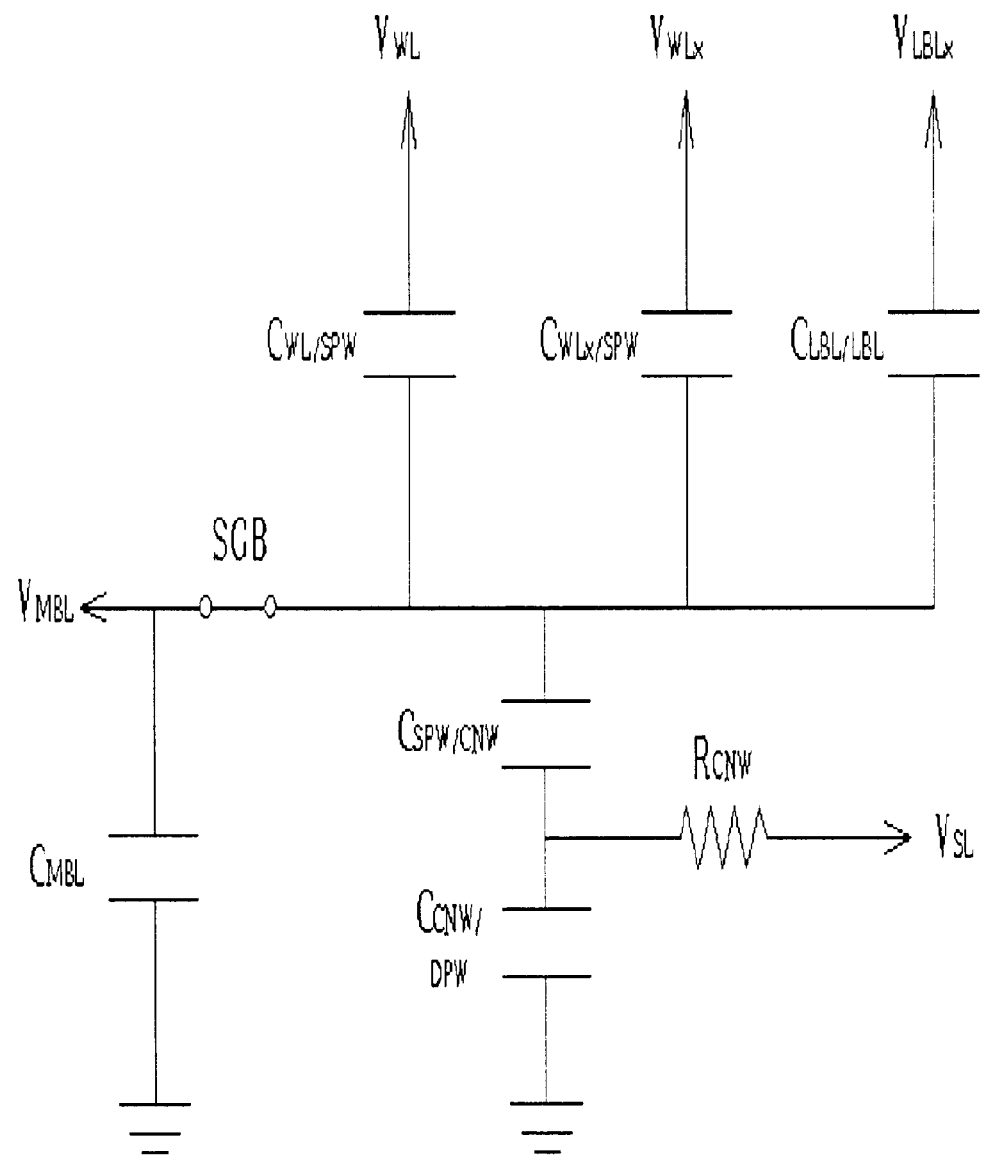
FIG. 4 is a second equivalent circuit diagram of the flash memory shown in FIG. 1.

Please refer to FIG. 4 in conjunction with FIG. 1 and FIG. 2. FIG. 4 is a second equivalent circuit diagram of the flash memory 10 shown in FIG. 1. $V_{MBL}$ stands for the voltage level of the main bit line 30 corresponding to the selected memory cell string 18. $V_{WL}$ stands for the voltage level of the word line $WL_x$ corresponding to the cell transistor required to be programmed. $V_{WLx}$ represents the voltage levels of the word lines $WL_x$ corresponding to the unselected cell transistors. $V_{LBLx}$ represents the voltage levels of the local bit lines LBL corresponding to the unselected memory cell string 18 adjacent to the selected memory cell string 18. $V_{SL}$ stands for the voltage level of the source line SL.

In addition, SGB represents the main bit line selecting transistor of the selected memory cell string 18, and functions as a switch. $C_{MBL}$ stands for a capacitor corresponding to the main bit line 30 of the selected memory cell string 18. $C_{WL/SPW}$ stands for a capacitor existing between the control gate of the selected cell transistor and the corresponding shallow P-well 16. $C_{WLx/SPW}$ stands for a capacitor existing between the control gates of the unselected cell transistors and the corresponding shallow P-well 16. $C_{LBL/LBL}$ represents a capacitor existing between the local bit line 26 of the selected memory cell string 18 and the adjacent local bit lines $LBL_x$ of the unselected memory cell string 18. $C_{SPW/CNW}$ stands for a junction capacitor between the shallow P-well 16 corresponding to the selected memory cell string 18 and the cell N-well 14. CCNW/DPW represents a junction capacitor between the cell N-well 14 and the deep P-well 12. In addition, $R_{CNW}$ represents the resistance value associated with the cell N-well 14.

Taking the flash memory 10 shown in FIG. 2 for example, suppose that the cell transistor $M_3$ within the memory cell string 34b needs to be programmed, $V_{MBL}$ is the voltage level of the main bit line $MBL_1$, $V_{WLx}$ is the voltage of the word lines $WL_1$, $WL_2$, $WL_4$–$WL_7$ of the unselected cell transistors $M_1$, $M_2$, and $M_4$–$M_7$, $V_{SL}$ is the voltage level of the source line SL, and SGB is the main bit line selecting transistor $SGB_1$ corresponding to the memory cell string 34b. Therefore, $C_{MBL}$ is a parasitic capacitor corresponding to the main bit line $MBL_1$, $C_{WL/SPW}$ is a coupling capacitor between the control gate of the cell transistor $M_3$ and the shallow P-well SPW $_1C_{WLx/SPW}$ is a coupling capacitor between the control gates of the unselected cell transistors $M_1$, $M_2$, $M_4$–$M_7$ and the shallow P-well $SPW_1$, $C_{LBL/LBL}$ is a coupling capacitor between the local bit line $LBL_1$ and the adjacent local bit lines $LBL_0$, $C_{SPW/CNW}$ is a junction capacitor between the shallow P-well $SPW_1$ and the cell N-well CNW. $C_{CNW/DPW}$ is a junction capacitor between the cell N-well CNW and the deep P-well DPW, and $R_{CNW}$ is the resistance of the cell N-well CNW.

In the preferred embodiment, each of the local bit lines $LBL_0$, $LBL_1$ includes 256 cell transistors. In addition, each of the local bit lines $LBL_0$, $LBL_1$ has a length equaling 80 $\mu$m, and the space between adjacent local bit lines $LBL_0$, $LBL_1$ equals 0.2 um. For the local bit lines $LBL_0$, $LBL_1$, the capacitance value is roughly equal to 2 pF per meter. In other words, the coupling capacitor $C_{LBL/LBL}$ between the local bit lines $LBL_0$, $LBL_1$ has a capacitance value equaling 16 fF. In addition, a cell transistor in the preferred embodiment utilizes an oxide-nitride-oxide (ONO) structure to form the desired floating gate. Therefore, the coupling capacitor between the control gate of the cell transistor and the shallow P-well has a capacitance value equal to 0.05 fF. For the selected cell transistor $M_3$ within the memory cell string 34b, the capacitance value of the corresponding capacitor $C_{WL/SPW}$ is equal to 0.05 fF. With regard to other unselected cell transistors $M_1$, $M_2$, $M_4$–$M_7$, each of the corresponding capacitors has the same capacitance value 0.05 fF. When the local bit line $LBL_1$ includes 256 cell transistors, these parallel capacitors associated with the 255 unselected cell transistors are connected to form an equivalent capacitor having a capacitance value equaling 12.75 fF. The junction capacitor $C_{CNW/DPW}$ between the cell N-well CNW and the deep P-well DPW has a capacitance value equaling 500 pF, and the junction capacitor C between the shallow P-well SPW and the SPW/CNW 1 cell N-well CNW has a capacitance value equaling 39 fF.

As shown in FIG. 4, the voltage level (+2.6V) of the local bit line $LBL_1$ is not high enough to enable the FN tunneling inside the cell transistor $M_3$ before $T_4$. When a charge pump circuit starts driving the voltage level of the source line SL to approach +7V after $T_4$, the voltage difference between the local bit line $LBL_1$ and the word line $WL_3$ is great enough to activate the FN tunneling inside the cell transistor $M_3$. That is, the charge pump circuit has to provide the source line SL with a driving current I to increase the voltage level of the source line SL. Please note that the main bit line selecting transistor SGB shown in FIG. 4 corresponds to an open circuit now.

For the flash memory 10 shown in FIG. 1, a plurality of cell transistors within a memory block are formed on the same cell N-well 14, and a plurality of memory blocks within the flash memory 10 are formed on the same deep P-well 12. In other words, compared with the shallow P-well 16, the cell N-well 14 and the deep P-well 12 have larger areas. Therefore, a capacitor between the cell N-well 14 and the deep P-well 12 corresponds to a greater capacitance value. As mentioned above, the capacitance value of the capacitor $C_{CNW/DPW}$ is equal to 500 pF, and is greater than other capacitors $C_{LBL/LBL}$ (16 fF), $C_{WL/SPW}$ (0.05 fF), $C_{WLx/SPW}$ (12.75 fF), and $C_{SPW/CNW}$ (39 fF). Please note that the charge pump circuit in the preferred embodiment drives the source line SL, and the maximum loading capacitor has a capacitance value equaling 500 pF. However, for the prior art charge pump circuit, it drives the main bit line, and the maximum loading capacitor has a capacitance value equaling 4 k*6 pF. Therefore, according to the preferred embodiment, the overall loading capacitor for the charge pump circuit corresponds to a smaller capacitance value.

Based on the structure shown in FIG. 4, the driving current I mostly is used to charge the capacitor $C_{CNW/DPW}$ to increase the voltage difference between two ends of the $C_{CNW/DPW}$. If the charge pump circuit wants to raise the voltage level of the source line SL from +3.3V to +7V in 10$\mu$s, the required driving current I is computed according to the following equation.

$$C_{CNW/DPW} * \Delta V = I * \Delta t$$

500 pF*(7−3.3)$V=I*10 \mu$ s

I=185$\mu$ A It is obvious that when the method of programming the flash memory according to the present invention is used for programming a cell transistor, the required driving current (185$\mu$ A) provided by the charge pump circuit corresponds to a magnitude less than that of a prior art driving current (16.8 mA). Therefore, the method of programming the flash memory according to the present invention needs a small driving current I to perform the programming operation. Because the output power of the charge pump circuit is greatly lowered, the size of the charge pump circuit is accordingly reduced.

In contrast to the prior art, the method of programming the flash memory according to the present invention first boosts the voltage level of a source line to a low voltage level, and then floats a local bit line. Next, the voltage level of the source line is further boosted toward a high voltage level so that the capacitance coupling works to raise the voltage level of the floating local bit line. In the end, the FN tunneling is induced to program the target cell transistor. When the charge pump circuit drives the source line, it encounters a smaller loading capacitor. Therefore, the charge pump circuit is merely required to provide a small driving current, and the generated driving current is capable of driving the voltage level of the source line to approach the wanted high voltage level. When the charge pump circuit operates according to the claimed method, the charge pump circuit does not need to have much driving power and a complicated circuit structure for outputting the prior art great driving current. From the above description, the method of programming the flash memory according to the present invention eases the power requirement of the charge pump circuit, and reduces the chip size occupied by the charge pump circuit.

What is claimed is:

1. A method of programming a non-volatile memory, the non-volatile memory comprising:

n cell transistors cascaded in series, each cell transistor having a control gate, a floating gate, a source, and a drain;

a local bit line positioned above the n cell transistors, the local bit line being electrically connected to a drain of a $1^{st}$ cell transistor;

a buried local bit line positioned under the n cell transistors, the buried local bit line being electrically connected to the drain of the $1^{st}$ cell transistor; and a source line positioned under the buried local bit line, the source line capable of being electrically connected to a source of a $n^{th}$ cell transistor;

the method comprising:

(a) inputting a word line voltage to a control gate of a $k^{th}$ cell transistor; and (b) floating the local bit line, and inputting a first source line voltage to the source line for increasing a voltage difference between the control gate of the $k^{th}$ cell transistor and the buried local bit line through capacitance coupling between the buried local bit line and the source line;

wherein the voltage difference is used to adjust an amount of electrons stored on the floating gate of the $k^{th}$ cell transistor for programming the $k^{th}$ cell transistor.

2. The method of claim 1 wherein step (a) further comprises inputting a bit line voltage to the drain of the $1^{st}$ cell transistor.

3. The method of claim 2 wherein step (a) further comprises inputting a second source line voltage to the source line.

4. The method of claim 3 wherein the bit line voltage is positive, and the word line voltage is negative.

5. The method of claim 4 wherein the first and second source line voltages are positive, and the second source line voltage is less than the first source line voltage.

6. The method of claim 1 wherein step (b) raises a voltage level of the buried local bit line, and when the voltage difference between the control gate of the $k^{th}$ cell transistor and the buried local bit line is greater than a predetermined value, the amount of electrons stored on the floating gate of the $k^{th}$ cell transistor is reduced for programming the $k^{th}$ cell transistor.

7. The method of claim 1 wherein when an $m^{th}$ cell transistor of the n cell transistors does not needed to be programmed, step (a) further comprises driving a control gate of the $m^{th}$ cell transistor to correspond to a first predetermined voltage, and step (b) further comprises driving the control gate of the $m^{th}$ cell transistor to correspond to a second predetermined voltage, wherein a voltage difference between the second predetermined voltage and the buried local bit line is less than a voltage difference between the first predetermined voltage and the buried local bit line.

8. The method of claim 7 wherein the second predetermined voltage is greater than the first predetermined voltage, and the second predetermined voltage is positive.

9. The method of claim 8 wherein when the control gate of the $m^{th}$ cell transistor is driven according to the second predetermined voltage instead of the first predetermined voltage, a voltage level of the buried local bit line is accordingly raised owing to capacitance coupling between the buried local bit line and the $m^{th}$ cell transistor.

10. The method of claim 1 wherein the non-volatile memory further comprises a main bit line selecting transistor electrically connected to the drain of the $1^{st}$ cell transistor and a main bit line, and step (a) further comprises driving the main bit line to correspond to a bit line voltage and turning on the selecting transistor for delivering the bit line voltage to the drain of the $1^{st}$ cell transistor.

11. The method of claim 10 wherein the non-volatile memory further comprises a source line selecting transistor electrically connected to the source of the $n^{th}$ cell transistor and the source line, and the method further comprises turning off the source line selecting transistor.

12. The method of claim 11 wherein step (b) floats the local bit line by turning off the main bit line selecting transistor.

13. The method of claim 1 wherein the non-volatile memory further comprises r cell transistors cascaded in series, the local bit line positioned above the r cell transistors is electrically connected to a drain of a $1^{st}$ cell transistor of the r cell transistors, the buried local bit line positioned under the r cell transistors is electrically connected to the drain of the $1^{st}$ cell transistor of the r cell transistors, the source line is capable of being electrically connected to a source of a $r^{th}$ cell transistor of the r cell transistors, and when a $s^{th}$ cell transistor does not need to be programmed, step (a) further comprises driving a control gate of the $s^{th}$ cell transistor to correspond to a first predetermined voltage, and step (b) further comprises driving the control gate of the $s^{th}$ cell transistor to correspond to a second predetermined voltage, wherein a voltage difference between the second predetermined voltage and the buried local bit line is less than a voltage difference between the first predetermined voltage and the buried local bit line.

14. The method of claim 13 wherein n is equal to r.

15. A non-volatile memory capable of implementing the method of claim 1.

* * * * *